(12) United States Patent
Denisenko et al.

(10) Patent No.: US 9,547,738 B1
(45) Date of Patent: Jan. 17, 2017

(54) INVARIANT CODE OPTIMIZATION IN HIGH-LEVEL FPGA SYNTHESIS

(71) Applicant: Altera Corporation, San Jose (CA)

(72) Inventors: Dmitry N. Denisenko, Toronto (CA);
John S. Freeman, Toronto (CA)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 14/273,295

(22) Filed: May 8, 2014

(51) Int. Cl.
  *G06F 17/50* (2006.01)

(52) U.S. Cl.
  CPC ......... *G06F 17/5054* (2013.01); *G06F 17/505* (2013.01)

(58) Field of Classification Search
  CPC . G06F 17/5045; G06F 17/505; G06F 17/5054
  See application file for complete search history.

(56) References Cited

U.S. PATENT DOCUMENTS

| | | | | |
|---|---|---|---|---|
| 2007/0169033 | A1* | 7/2007 | Metzgen | 717/140 |
| 2008/0244472 | A1* | 10/2008 | Nayak et al. | 716/2 |
| 2013/0125097 | A1* | 5/2013 | Ebcioglu | G06F 17/5045 717/136 |
| 2013/0212365 | A1* | 8/2013 | Chen et al. | 713/1 |
| 2013/0305021 | A1* | 11/2013 | Grover et al. | 712/214 |

* cited by examiner

*Primary Examiner* — Vuthe Siek
*Assistant Examiner* — Aric Lin
(74) *Attorney, Agent, or Firm* — Fletcher Yoder, P.C.

(57) ABSTRACT

A method of programming or configuring an integrated circuit device using a high-level language includes parsing a logic flow to be embodied in the integrated circuit device to identify invariant logic flow, converting the invariant logic flow into separate instruction blocks, incorporating the separate instruction blocks into a high-level language representation of a configuration of resources of the integrated circuit device, and compiling the high-level language representation to configure said integrated circuit device. The high-level language representation can be executed to generate a configuration bitstream for the programmable integrated circuit device, or can be run on a processor on the programmable integrated circuit device to instantiate the configuration.

17 Claims, 5 Drawing Sheets

INVARIANT CODE OPTIMIZATION IN HIGH-LEVEL FPGA SYNTHESIS

FIELD OF THE INVENTION

This invention relates to the use of a high-level language to specify the circuitry of an integrated circuit device, and particularly to configure a programmable integrated circuit device such as a field-programmable gate array (FPGA) or other type of programmable logic devices (PLD).

BACKGROUND OF THE DISCLOSURE

Programming software allowing a user to lay out logic as desired and then translate that logic into a configuration for a programmable device is commonly provided in connection with programmable devices. Such software commonly includes pre-defined functions for configuring certain commonly-used structures.

Although available programming software allows users to implement almost any desired logic design within the capabilities of the device being programmed, most such software requires knowledge of hardware description languages such as VHDL or Verilog. However, many potential users of programmable devices are not well-versed in hardware description languages and may prefer to program devices using a higher-level programming language. But if the underlying logic to be implemented includes invariant elements, the implementation of that logic may be inefficient.

SUMMARY OF THE DISCLOSURE

One high-level programming language that may be adopted for specifying circuitry of an integrated circuit device, such as for configuring a programmable device, is OpenCL (Open Computing Language), although use of other high-level languages, and particularly other high-level synthesis languages, including C, C++, Fortran, C#, F#, BlueSpec, and Matlab, is also within the scope of this disclosure.

In OpenCL, computation is performed using a combination of a host and kernels, where the host is responsible for input/output (I/O) and setup tasks, and kernels perform computation on independent inputs. A kernel compiler converts a kernel into a hardware circuit, implementing an application from an OpenCL description, through hardware generation, system integration, and interfacing with a host computer. The compiler may be based on an open-source Low-Level Virtual Machine compiler extended to enable compilation of OpenCL applications. The compiler parses, analyzes, optimizes and implements an OpenCL kernel as a high-performance pipelined circuit, suitable for implementation on a programmable device such as an FPGA.

In one variant, that circuit is input to the programming tools appropriate for the particular programmable device, which generates a configuration bitstream to program the device with that circuit. In another variant, the device also has an embedded hard processor or may be configured with an embedded soft processor, to run OpenCL (or other high-level) code, or an external processor may be used. The OpenCL or other high-level code can be run by executing the host program on the embedded or external processor. The system may then be compiled in conjunction with the aforementioned programming tools so that, when executed on the embedded or external processor, it instantiates the circuit equivalent of the kernel.

As disclosed herein, invariant logic flow may be identified. Based on the identification, the hardware circuitry corresponding to the logic implemented in the hardware circuitry may be activated only once per a group of threads. The invariant logic flow may result in optimizations that enhance the reduction of the resulting hardware size, memory bandwidth, and latency, and increase throughput.

In accordance with the present invention there is provided a method of programming or configuring an integrated circuit device using a high-level language. The method includes using a software tool on a processor to parse a logic flow to be embodied in the integrated circuit device to identify invariant logic flow, converting the invariant logic flow into separate instruction blocks, incorporating said separate instruction blocks into a high-level language representation of a configuration of resources of said integrated circuit device, and compiling the high-level language representation to configure said integrated circuit device.

A machine-readable data storage medium encoded with instructions to perform the method also is provided, as is a programmable device configured according to the method.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION OF THE INVENTION

To provide an overall understanding of the invention, certain illustrative embodiments will now be described. However, it will be understood by one of ordinary skill in the art that the systems and methods described herein may be adapted and modified as is appropriate for the application being addressed and that the systems and methods described herein may be employed in other suitable applications, and that such other additions and modifications will not depart from the scope hereof.

In OpenCL, an application is executed in two parts—a host and a kernel. The host is a program responsible for processing I/O requests and setting up data for parallel processing. When the host is ready to process data, it can launch a set of threads on a kernel, which represents a unit of computation to be performed by each thread.

Each thread executes a kernel computation by loading data from memory as specified by the host, processing those data, and then storing the results back in memory to be read by the user, or by the user's application. In OpenCL terminology, a single unit of execution of the kernel is considered a thread. A slice of input data is usually associated with each thread. Results may be computed for a group of threads at one time. Threads may be grouped into workgroups, which allow data to be shared between the threads in a workgroup. Normally, no constraints are placed on the order of execution of threads in a workgroup.

For the purposes of data storage and processing, each kernel may have access to more than one type of memory—e.g., global memory shared by all threads, local memory shared by threads in the same workgroup, and private memory used only by a single thread.

Execution of an OpenCL application may occur partially in the host program and partially by executing one or more kernels. For example, in vector addition, the data arrays representing the vectors may be set up using the host program, while the actual addition may be performed using one or more kernels. The communication between these two parts of the application may be facilitated by a set of OpenCL functions in the host program. These functions define an interface between the host and the kernel, allowing the host program to control what data is processed and when that processing begins, and to detect when the processing has been completed.

A programmable device such as an FPGA may be programmed using a high-level language such as OpenCL by starting with a set of kernels and a host program. The kernels are compiled into hardware circuit representations using a Low-Level Virtual Machine (LLVM) compiler that may be extended for this purpose. The compilation process begins with a high-level parser, such as a C-language parser, which produces an intermediate representation (IR) for each kernel. The intermediate representation may be in the form of instructions and dependencies between them. This representation may then be optimized to a target programmable device.

The compiled kernels are then instantiated in a system that preferably contains an interface to the host as well as a memory interface. The host interface allows the host program to access each kernel. This permits setting workspace parameters and kernel arguments remotely. The memory serves as global memory space for an OpenCL kernel. This memory can be accessed via the host interface, allowing the host program to set data for kernels to process and retrieve computation results. Finally, the host program may be compiled using a regular compiler for the high-level language in which it is written (e.g., C++).

To compile kernels into a hardware circuit, each kernel is implemented from basic block modules. Each basic block module comprises an input and an output interface with which it talks to other basic blocks, and implements an instruction such as load, add, subtract, store, etc.

The next step in implementing each kernel as a hardware circuit is to convert each basic block module into a hardware module. Each basic block module is responsible for handling the operations inside of it. To function properly, a basic block module also should be able to exchange information with other basic blocks. Each basic block, once instantiated, processes the data according to the instructions contained within the block and produces output that can be read by other basic blocks, or directly by a user.

Once each kernel has been described as a hardware circuit, a design may be created including the kernels as well as memories and an interface to the host platform. To prevent pipeline overload, the number of threads allowed in a workgroup, and the number of workgroups allowed simultaneously in a kernel, may be limited.

Embodiments of the invention may be described with reference to FIGS. 1-6.

Figure 1:
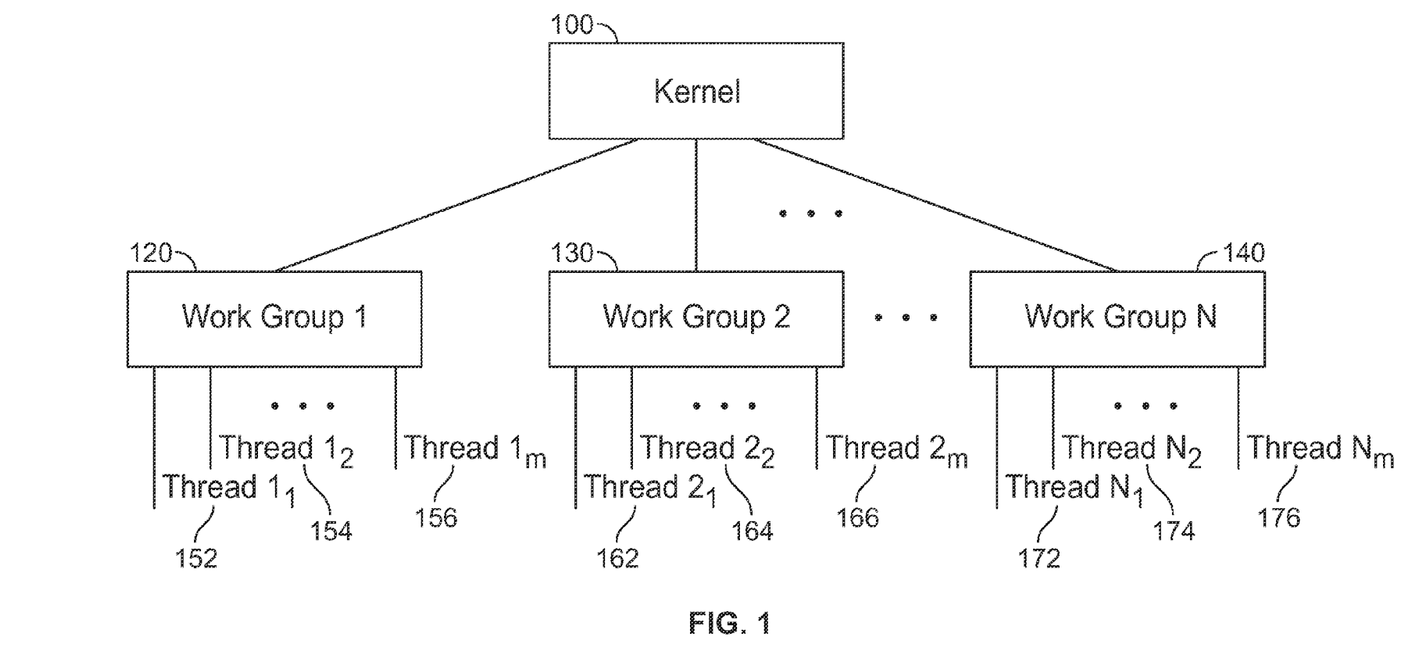
FIG. 1 is a simplified block diagram of thread hierarchy in OpenCL, according to an illustrative embodiment.

FIG. 1 is a simplified block diagram of thread hierarchy in OpenCL, according to an illustrative embodiment. Kernel 100 is an example of a kernel invocation including a number of threads. The threads may be generally be grouped into N workgroups containing m threads each, where N and m are a suitably chosen integers. For example, FIG. 1 shows a first workgroup 120, a second workgroup 130, and an Nth workgroup 140. The first workgroup 120 may include thread $1_1$ 152, thread $1_2$ 154 and thread $1_m$ 156. The second workgroup 130 may include thread $2_1$ 162, thread $2_2$ 164 and thread $2_m$ 166. The third workgroup 140 may include thread $N_1$ 172, thread $N_2$ 174 and thread $N_m$ 176.

An OpenCL kernel may describe the calculation that the hardware circuit implementing the kernel will perform from a point of view of a single thread acting on a slice of data. Processing of the entire data set may be performed by launching a hierarchical group of threads in parallel, where each thread has a different thread identifier and operates on a different slice of the entire data set. This notion is described in greater detail in the following example.

The following logic is an exemplary kernel which uses thread identifiers to specify different slices of data on which each thread operates.

```
kernel void do_stuff (int *src, int *dst, int k){
    int thread_id=get_thread_id( );
    int group_id=get_group_id( );
    int X=src[group_id];
    int Y=src[k];
    int Z=sin(Y);
    dst[thread_id]=src[thread_id]+X+Y+Z;
}
```

The above logic is designed to copy a first array src[ ] to a second array dst[ ] while adding src[group_id], src[k], and sin(src[k]) to each element of second array dst[ ], where k is a user specified constant. If each array src[ ] and dst[ ] has size N, the above kernel may be launched with N threads. In this case, the function get_thread_id( ) may return a value between 0 to N−1 for each thread.

As described above in connection with FIG. 1, threads may be partitioned into workgroups. For example, a workgroup may be a set of threads that execute simultaneously or one after another such that each thread in a workgroup has the same return value for the get_group_id( ) function. All threads in a first workgroup begin executing before the threads in a second workgroup.

A conventional way of implementing the above logic in a hardware circuit is for each of N threads to first fetch three values, i.e., src[group_id], src[k], and src[thread_id], from the src[ ] array, then compute the sine of src[k], and finally add X, Y, and Z to src[thread_id], and then store the result of the addition in the dst[ ] array. Thus, the total number of memory accesses to the array src[ ] is 3N, the total number of additions is 3N, and the total number of sin( ) function calls is N.

A more efficient way of implementing the above logic in a hardware circuit may be to first fetch src[k] and store its value in memory corresponding to Y and next compute Z=sin(Y). Then, whenever a new workgroup may be started, src[group_id] may be fetched and added to Y. Thus, in this implementation, the total number of memory accesses to the array src[ ] is N+#groups+1 and the total number of additions is N+#groups+1, where #groups denotes the number of threads in a workgroup.

Therefore, the efficient implementation of the above logic in a hardware circuit may improve performance over the conventional implementation of the above logic in a hardware circuit because the #groups is usually much less than N. One difference between the conventional implementation and the efficient implementation described in connection with the above logic is that the efficient implementation identifies expressions of logic that are invariant with respect to a level of thread hierarchy and executes the logic of the invariant expressions only once. Performance gains may thus be realized by identifying and minimizing repetitive execution of invariant logic. This process is described in greater detail in connection with FIG. 2 below.

Figure 2:
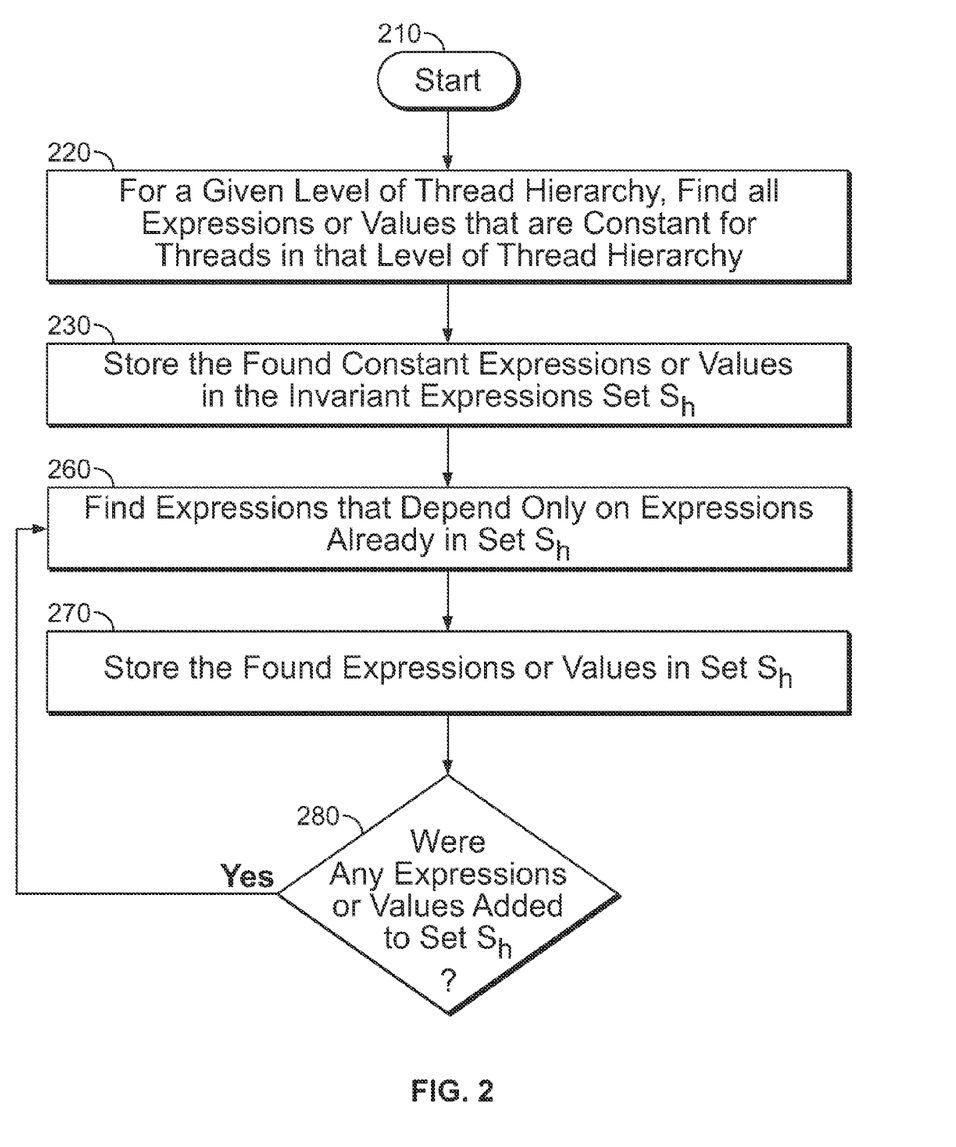
FIG. 2 shows a method, which may be used with embodiments of the invention, for identifying invariant expressions.

FIG. 2 shows a method, which may be used with embodiments of the invention, for identifying invariant expressions. The method may begin at step 210. At step 220, a search for all expressions or values that are constant in a given level of thread hierarchy may be performed. The search may first be made at the thread hierarchy level of the kernel. For example, at the thread hierarchy level of the kernel, e.g., kernel 100 of FIG. 1 which includes all the threads that are executed in connection with kernel 100, function arguments such as 'k', 'src', and 'dst', as described above in connection with the logic example, are expressions that are constant. The function arguments 'k', 'src', and 'dst' are constant expressions at the thread hierarchy level of the kernel because they are constant across all the threads that are executed in connection with kernel 100. Constant values, such as the integer '12', are further examples of values that are constant.

At the thread hierarchy level of a workgroup, e.g., any of workgroups 120, 130, or 140 of FIG. 1, function arguments such as 'get_group_id( )', as described above in connection with the logic example, are expressions that are constant. The function argument 'get_group_id( )' is a constant expression at the thread hierarchy level of a workgroup because it is constant across all threads within a workgroup. The function argument 'get_group_id( )' is not a constant expression at the thread hierarchy level of the kernel because its value changes across different workgroups and therefore it is not constant across all the threads that are executed in connection with the kernel.

At step 230, all constant expressions of values found at step 220 may be stored in a set $S_h$ of invariant expressions.

At step 260, a search for all expressions or values that are constant in the current level of thread hierarchy and all expressions that depend solely on invariant expressions already in set $S_h$ may be performed.

Expressions that depend solely on invariant expressions already in set $S_h$ may be determined. Examples of such expressions are:
(1) Load/store instructions whose arguments are already stored in the set $S_h$, e.g., 'src[k]' since both 'src' pointer and 'k' are already in set $S_h$ from step 220.
(2) Arithmetic operations on expressions already stored in the set $S_h$, e.g., 'X+Y' at the thread hierarchy level of a workgroup, where X and Y are described in connection with the logic example above.
(3) Function calls with arguments already stored in the set $S_h$, e.g., 'sin(Y)'.

This step may be performed multiple times to uncover nested invariant expressions. For example, to discover that a nested expression such as sin(src[dst[<const>]]) is invariant, where <const> represents constant value, the following may be performed:
(1) Add constant value <const> to set $S_h$,
(2) Add dst[<const>] to set $S_h$,
(3) Add src[dst[<const>]] to set $S_h$, and finally
(4) Add sin(src[dst[<const>]]) to set $S_h$.

At step 270, all invariant expressions found at step 260 may be stored in the set $S_h$.

At step 280, a determination may be made as to whether any new invariant expressions were added to the set $S_h$ at step 270. In response to a determination that no new invariant expressions were added to the set $S_h$, step 220 to 270 may be applied to another level of thread hierarchy, e.g., the highest level of thread hierarchy—the kernel. If all level of thread hierarchy have already been analyzed for invariance expressions, the method may terminate. Otherwise, the method proceeds back to step 260.

It will be understood that the steps of the process of FIG. 2 are merely exemplary of the order in which these steps may occur. The steps may occur in any order that is desired, such that it still performs the goals of the claimed invention.

Once the set of all invariant expressions is identified for each thread hierarchy level, identified invariant expressions may be placed into separate instruction blocks prior to generating the hardware circuitry for implementing the logic. Referring back to the logic of an exemplary kernel described in connection with FIG. 2 above, upon the application and completion of the method described in FIG. 2 to the exemplary kernel the identified invariant expressions or logic flow may be converted into separate instructions blocks and the exemplary kernel may be rewritten as:

```
kernel void do stuff (int *src, int *dst, int k) {
kernel invariant logic flow:
int Y=src[k];
int z=sin(Y);
int T1=Y+Z;
workgroup invariant logic flow:
int group_id=get_group_id ( );
int X=src[group id];
int T2=T1+X;
non-invariant logic flow:
int thread_id=get_thread_id( );
dst[thread_id]=src[thread_id]+T2;
}
```

After converting the identified invariant logic flow into separate instruction blocks, the separate instruction blocks may be incorporated into a high-level language representation of a configuration of resources of the integrated circuit device implementing the logic flow. The high-level language representation may be compiled to configure the integrated circuit device.

The following guidelines may be considered during the configuration of the integrated circuit device:
(1) Consider a first separate instruction block corresponding to a first invariant logic flow and separate instruction blocks corresponding to invariant logic flow subsequent to the first invariant logic flow. The hardware circuitry corresponding to separate instruction blocks subsequent to the hardware circuitry corresponding to the first separate instruction block may be stalled until the hardware circuitry corresponding to the first separate instruction block computes an output.
(2) If the inputs to hardware circuitry corresponding to a given logic flow do not change, then the outputs of the hardware circuitry corresponding to the given logic flow are available for use right away and the hardware circuitry corresponding to logic flow subsequent to the given logic flow can use the computed outputs.

(3) If the inputs to hardware circuitry corresponding to a given logic flow do change, then the outputs of the hardware circuitry corresponding to the given logic flow are re-computed to account for the changed inputs and the hardware circuitry corresponding to logic flow subsequent to the given logic flow stalls until the new outputs are ready.

Some portions of the logic flow to be embodied as circuitry in the integrated circuit device may include loops. For example, as shown in the logic flow below, invariant expressions for a thread hierarchy may be within a loop:

```
kernel void do_stuff (int *src, int *dst, int k) {
  int thread_id=get_thread_id( );
  int Y=0;
  do {
    Y+=src[k+i];
    i++;
  } while (i<10);
  dst[thread_id]=src[thread_id]+Y;
}
```

The do-while loop above is an example of invariant logic flow, or an invariant loop, at the thread hierarchy level of the kernel because the bounds of the loop, i.e., 0 and 10, are constants and the logic flow inside the loop does not depend on a thread identifier (even though the loop iterator 'i++' changes).

To identify an invariant loop, the body of the entire loop may need to be considered. For example, the method of FIG. 2 may be modified to deem a loop invariant if all logic flow inside the body of the loop is invariant, including the loop bounds, but excluding the loop iterator.

Once separate instruction blocks have been derived, and simplified to the extent desired, known techniques can be used to configure a programmable device. For example, the logic flow incorporated in an OpenCL kernel is converted in method 300, diagrammed in FIG. 3, into a configuration bitstream for a programmable device.

Figure 3:
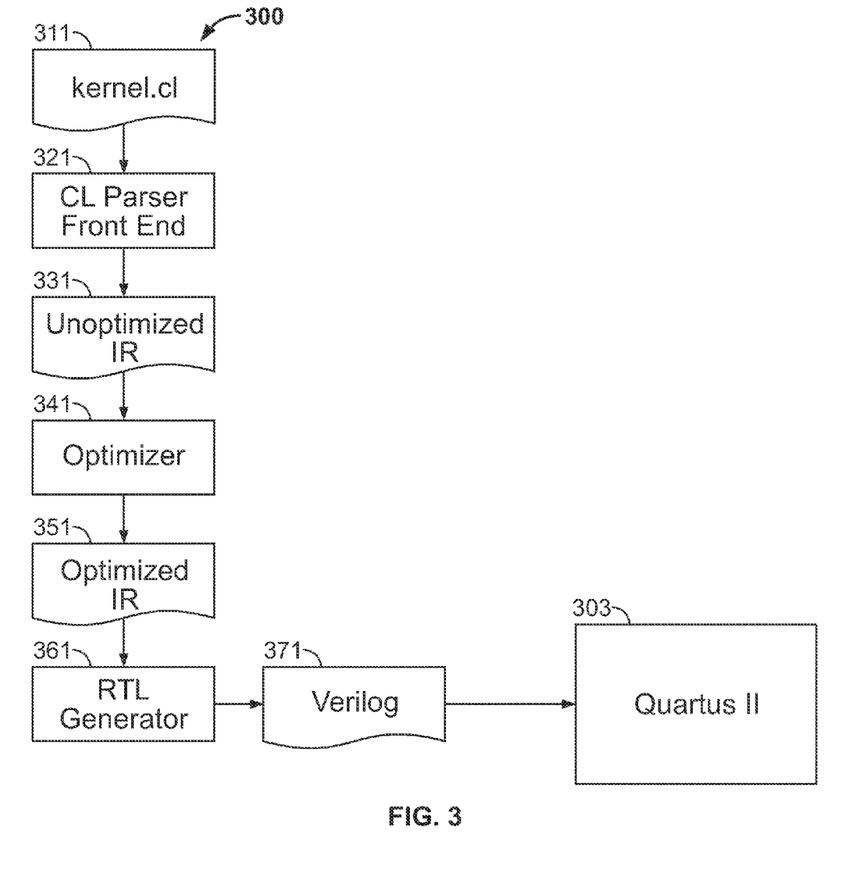
FIG. 3 shows a method, which may be used with embodiments of the invention, for using a high-level language to configure a programmable device.

Method 300 starts with a kernel file (kernel.cl) 311. Parser front end 321 derives unoptimized intermediate representation 331 from kernel file 311, which is converted by optimizer 341 to an optimized intermediate representation 351. The optimization process includes compiler techniques to make the code more efficient, such as, e.g., loop unrolling, memory-to-register conversion, dead code elimination, etc. A Register Timing Language (RTL) 361 generator converts optimized intermediate representation 351 into a hardware description language representation 371, which may be written in any hardware description language such as Verilog (shown) or VHDL.

Hardware description language representation(s) 371 of the kernel(s) are compiled into a programmable device configuration by appropriate software 303. For example, for FPGA devices available from Altera Corporation, of San Jose, Calif., software 303 might be the QUARTUS® II software provided by Altera.

Although some or all of the various functions in method 300 may be executed by special-purpose hardware circuits dedicated to those functions, most or all of those functions would more commonly be performed by a processor. As previously noted, the device being configured could be a fixed-logic device or a programmable device. In the case of fixed-logic device, the processor would necessarily be external to the device, as the device will not yet have been formed. In the case of a programmable device, as previously noted, the processor could be external to the device being configured, or could be embedded in the device, and if the processor is embedded, it could be a "hard" processor or a "soft" processor. If the embedded processor is a "soft" processor, it also may be configured using software 303. If the embedded processor is a "hard" processor, software 303 may configure appropriate connections to the hard processor.

Thus it is seen that a method for configuring a fixed or programmable integrated circuit device using a high-level synthesis language, while reducing the resources consumed, particularly on a programmable device, has been provided.

Instructions for carrying out a method according to this invention for configuring an integrated circuit device may be encoded on a non-transitory machine-readable memory medium (e.g., a magnetic disk, a nonvolatile RAM, or an optical disk such as a CD-ROM or DVD-ROM), to be executed by a suitable computer or similar device to implement the method of the invention for programming or configuring PLDs or other devices with a configuration described by a high-level synthesis language as described above. For example, a personal computer may be equipped with an interface to which a PLD can be connected, and the personal computer can be used by a user to program the PLD using suitable software tools as described above.

Figure 4:
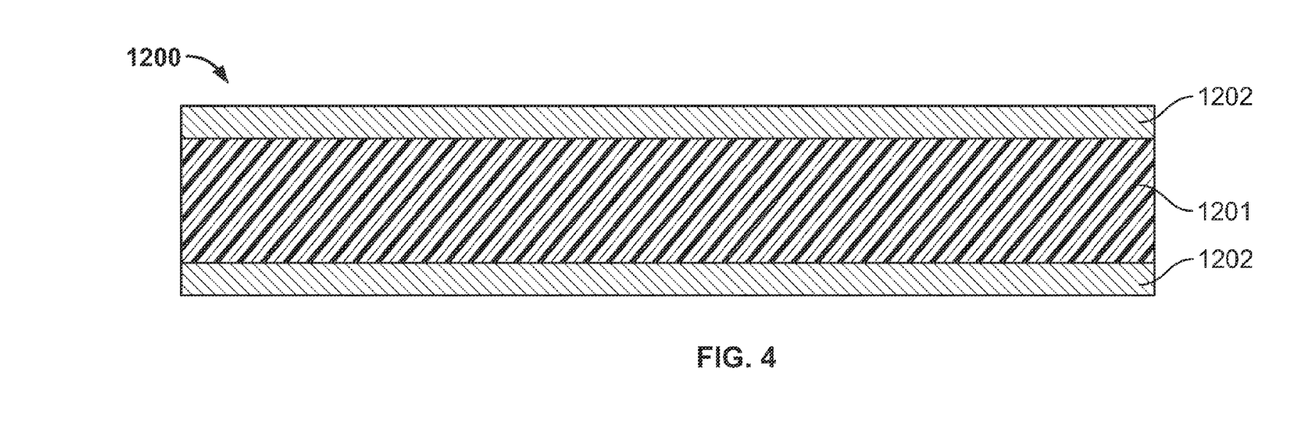
FIG. 4 is a cross-sectional view of a magnetic data storage medium encoded with a set of machine-executable instructions for performing the method according to the present invention.

FIG. 4 presents a cross section of a magnetic data storage medium 1200 which can be encoded with a machine executable program that can be carried out by systems such as the aforementioned personal computer, or other computer or similar device. Medium 1200 can be a floppy diskette or hard disk, or magnetic tape, having a suitable substrate 1201, which may be conventional, and a suitable coating 1202, which may be conventional, on one or both sides, containing magnetic domains (not visible) whose polarity or orientation can be altered magnetically. Except in the case where it is magnetic tape, medium 1200 may also have an opening (not shown) for receiving the spindle of a disk drive or other data storage device.

The magnetic domains of coating 1202 of medium 1200 are polarized or oriented so as to encode, in a manner that may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 5:
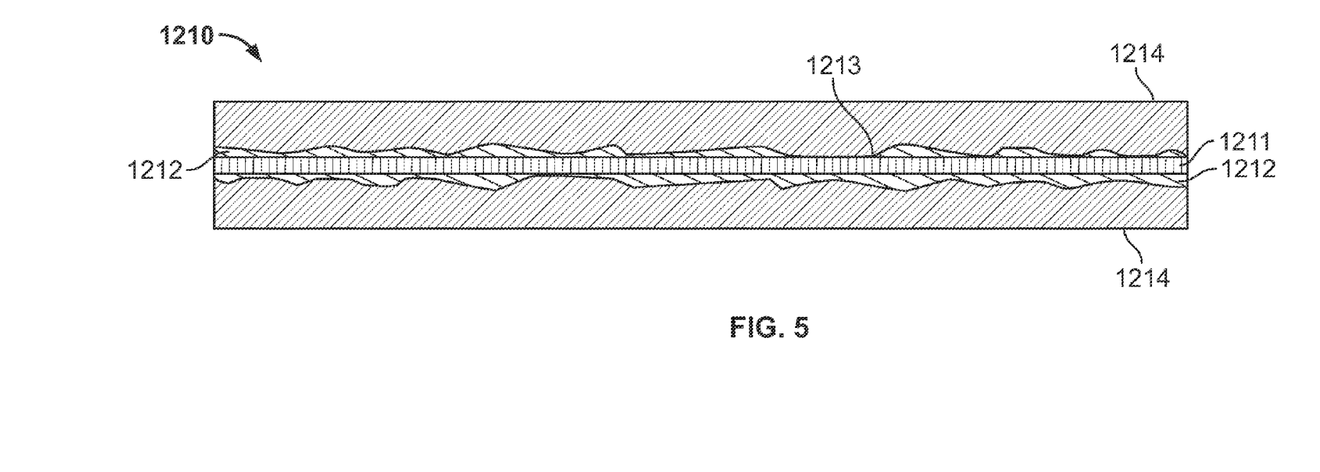
FIG. 5 is a cross-sectional view of an optically readable data storage medium encoded with a set of machine executable instructions for performing the method according to the present invention.

FIG. 5 shows a cross section of an optically-readable data storage medium 1210 which also can be encoded with such a machine-executable program, which can be carried out by systems such as the aforementioned personal computer, or other computer or similar device. Medium 1210 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk that is optically readable and magneto-optically rewriteable. Medium 1210 preferably has a suitable substrate 1211, which may be conventional, and a suitable coating 1212, which may be conventional, usually on one or both sides of substrate 1211.

In the case of a CD-based or DVD-based medium, as is well known, coating 1212 is reflective and is impressed with a plurality of pits 1213, arranged on one or more layers, to encode the machine-executable program. The arrangement of pits is read by reflecting laser light off the surface of coating 1212. A protective coating 1214, which preferably is substantially transparent, is provided on top of coating 1212.

In the case of magneto-optical disk, as is well known, coating 1212 has no pits 1213, but has a plurality of magnetic domains whose polarity or orientation can be changed magnetically when heated above a certain temperature, as by a laser (not shown). The orientation of the domains can be read by measuring the polarization of laser light reflected from coating 1212. The arrangement of the domains encodes the program as described above.

A PLD 140 programmed according to the present invention may be used in many kinds of electronic devices. One possible use is in a data processing system 1400 shown in FIG. 6. Data processing system 1400 may include one or more of the following components: a processor 1401; memory 1402; I/O circuitry 1403; and peripheral devices 1404. These components are coupled together by a system bus 1405 and are populated on a circuit board 1406 that is contained in an end-user system 1407.

Figure 6:
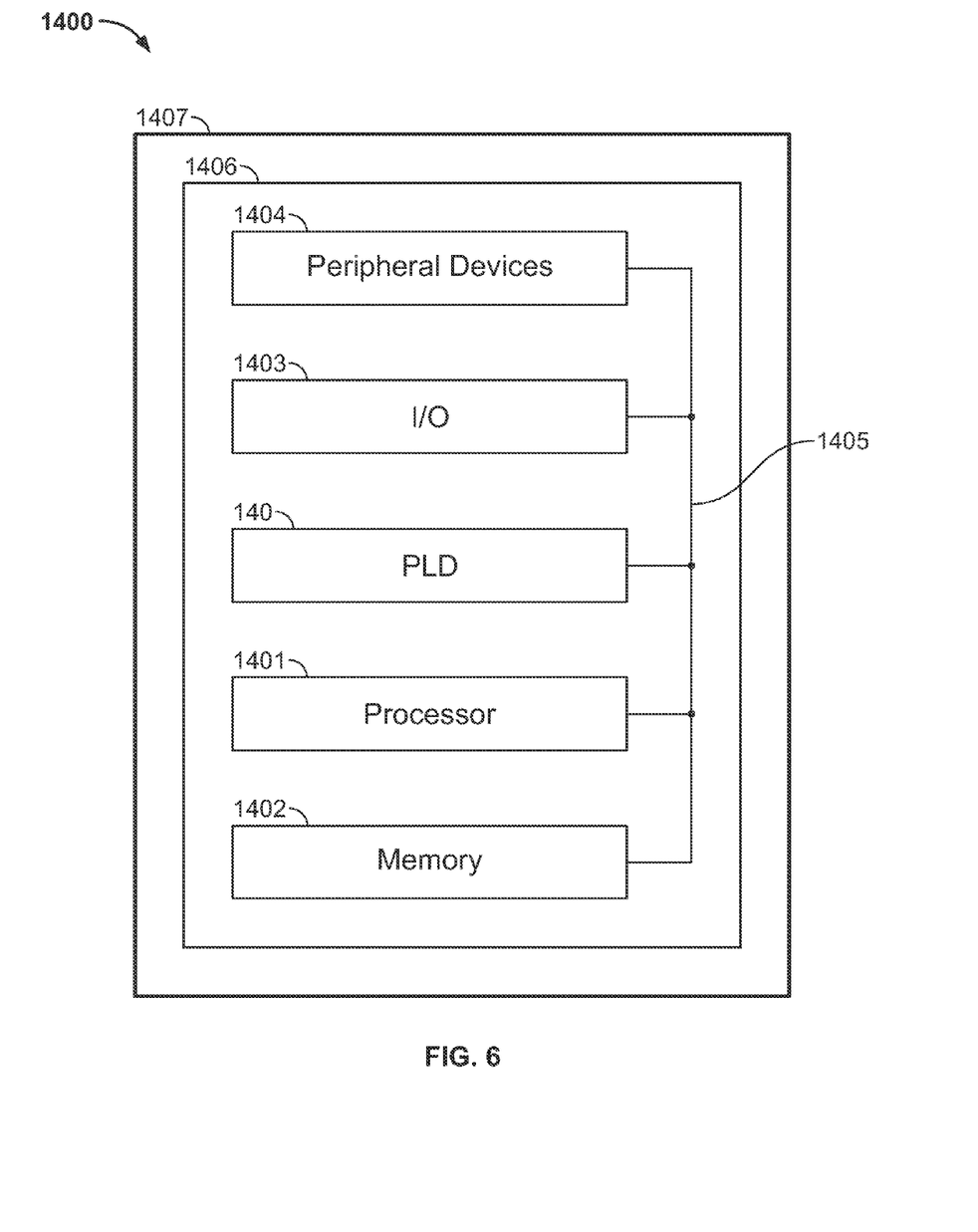
FIG. 6 is a simplified block diagram of an illustrative system employing a programmable logic device incorporating the present invention.

System 1400 can be used in a wide variety of applications, such as computer networking, data networking, instrumentation, video processing, digital signal processing, or any other application where the advantage of using programmable or reprogrammable logic is desirable. PLD 140 can be used to perform a variety of different logic functions. For example, PLD 140 can be configured as a processor or controller that works in cooperation with processor 1401. PLD 140 may also be used as an arbiter for arbitrating access to shared resources in system 1400. In yet another example, PLD 140 can be configured as an interface between processor 1401 and one of the other components in system 1400. It should be noted that system 1400 is only exemplary, and that the true scope and spirit of the invention should be indicated by the following claims.

Various technologies can be used to implement PLDs 140 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A method of configuring an integrated circuit device using a high-level language, said method comprising:
   using a software tool on a processor, parsing a logic flow to be embodied as circuitry in said integrated circuit device, wherein said parsing further comprises:
      identifying a first invariant logic flow in a first level of a plurality of ranked levels of thread hierarchy of said logic flow, wherein each level of the plurality of ranked levels comprises at least one thread and the first invariant logic flow in the first level is invariant with respect to the first level;
      identifying a second invariant logic flow in a second level of the plurality of ranked levels, wherein the second invariant logic flow in the second level is invariant with respect to the second level;
   converting said first invariant logic flow in the first level and said second invariant logic flow in the second level into separate instruction blocks, each of the separate instruction blocks to be embodied as separate circuitry;
   incorporating said separate instruction blocks into a high-level language representation of a configuration of resources of said integrated circuit device; and
   compiling said high-level language representation to configure said integrated circuit device.

2. The method of claim 1, wherein said identifying invariant logic flow further comprises identifying in said logic flow at least one of invariant expressions and expressions that depend solely on said invariant expressions.

3. The method of claim 1, wherein:
   said parsing the logic flow further comprises using said software tool on said processor to parse said logic flow to identify invariant loops; and
   said converting further comprises using said software tool on said processor to simplify said loops using separate instruction blocks.

4. The method of claim 1, wherein said integrated circuit device is a programmable integrated circuit device and said compiling comprises deriving, from said high-level language representation, a configuration bitstream that configures said programmable integrated circuit device as said circuitry.

5. The method of claim 1, wherein said high-level language is OpenCL kernel.

6. The method of claim 5, wherein said logic flow is represented as an OpenCL kernel.

7. A non-transitory machine readable storage medium encoded with instructions for performing a method of configuring an integrated circuit device using a high-level language, said instructions comprising:
   instructions to parse a logic flow, to be embodied as circuitry in said integrated circuit device, to:
      identify first invariant logic flow in a first level of a plurality of ranked levels of thread hierarchy of said logic flow, wherein the first invariant logic flow in the first level is invariant with respect to the first level;
      identify second invariant logic flow in a second level of the plurality of ranked levels, wherein the second invariant logic flow in the second level is invariant with respect to the second level;
      wherein said each level comprises at least one thread;
   instructions to convert said first invariant logic flow and said second invariant logic flow into separate instruction blocks, each of the separate instruction blocks to be embodied as separate circuitry;
   instructions to incorporate said separate instruction blocks into a high-level language representation of a configuration of hardware resources of said integrated circuit device; and
   instructions to compile said high-level language representation to configure said hardware resources of said integrated circuit device as said circuitry.

8. The non-transitory machine readable storage medium of claim 7, wherein said instructions to identify invariant logic flow comprises instructions to identify in said logic flow at least one of invariant expressions and expressions that depend solely on said invariant expressions.

9. The non-transitory machine readable storage medium of claim 7, wherein:
   said instructions to parse said logic flow comprise instructions to parse said logic flow to identify invariant loops; and
   said instructions to convert further comprise instructions to simplify said loops using separate instruction blocks.

10. The non-transitory machine readable storage medium of claim 7, wherein said integrated circuit device is a programmable integrated circuit device and said instructions to compile comprise instructions to derive, from said high-level language representation, a configuration bitstream that configures said programmable integrated circuit device as said circuitry.

11. The non-transitory machine readable storage medium of claim 7, wherein said high-level language is OpenCL.

12. A programmable integrated circuit device configured as circuitry using a high-level language, said configured programmable integrated circuit device comprising:
  logic structures for:
    identifying a first invariant logic flow in flow control in a first level of a plurality of ranked levels of thread hierarchy of said logic flow, wherein each level of the plurality of ranked levels comprises at least one thread and the first invariant logic flow in the first level is invariant with respect to the first level;
    identifying a second invariant logic flow in a second level of the plurality of ranked levels, wherein the second invariant logic flow in the second level is invariant with respect to the second level;
    converting said first invariant logic flow and said second invariant logic flow into separate instruction blocks, each of the separate instruction blocks to be embodied as separate circuitry; and
    implementing said separate instruction blocks in place of said flow control; wherein:
    hardware resources of said programmable integrated circuit device are conserved by avoiding implementation of flow control structures in said circuitry.

13. The programmable integrated circuit device of claim 12, wherein said identifying invariant logic flow further comprises identifying in said flow control at least one of invariant expressions and expressions that depend solely on said invariant expressions.

14. The programmable integrated circuit device of claim 12, wherein said logic structures are implemented by compiling a high-level language representation to generate a configuration bitstream that configures said hardware resources as said circuitry.

15. The programmable integrated circuit device of claim 12, wherein said logic structures further identify invariant loops.

16. The programmable integrated circuit device of claim 12, wherein said high-level language is OpenCL.

17. The programmable integrated circuit device of claim 12, wherein said logic flow is represented as an OpenCL kernel.

* * * * *